United States Patent [19]
Uchida et al.

[11] Patent Number: 6,079,099
[45] Date of Patent: Jun. 27, 2000

[54] ELECTRONIC COMPONENT MANUFACTURING METHOD

[75] Inventors: Hideyuki Uchida; Masanobu Ono, both of Kobe, Japan

[73] Assignee: Sumitomo Metal Industries Limited, Osaka, Japan

[21] Appl. No.: 09/251,130

[22] Filed: Feb. 16, 1999

Related U.S. Application Data

[60] Provisional application No. 60/103,854, Oct. 12, 1998.

[51] Int. Cl.$^7$ .................................................... H05K 3/34
[52] U.S. Cl. .............................. 29/837; 29/832; 29/835; 174/52.1; 361/816
[58] Field of Search ............................. 29/832, 835, 837, 29/839, 843; 174/52.1; 361/816, 818

[56] References Cited

U.S. PATENT DOCUMENTS

| | | | |
|---|---|---|---|
| 3,337,950 | 8/1967 | Gray | 29/837 |
| 4,714,905 | 12/1987 | Bernstein et al. | 29/832 X |
| 4,841,414 | 6/1989 | Hibino et al. | 361/424 |
| 4,908,936 | 3/1990 | Matsuura | 29/837 |
| 5,093,282 | 3/1992 | Ohno et al. | 29/832 |
| 5,311,402 | 5/1994 | Kobayashi et al. | 361/760 |
| 5,559,676 | 9/1996 | Gessaman | 361/752 |
| 5,581,875 | 12/1996 | Hibino et al. | 29/837 X |
| 5,933,946 | 8/1999 | Habermeier et al. | 29/837 |

*Primary Examiner*—Lee Young
*Assistant Examiner*—Rick Kiltae Chang
*Attorney, Agent, or Firm*—Barnes & Thornburg

[57] ABSTRACT

A manufacturing method of an electronic component comprises the steps of: mounting components on a sheet substrate having a plurality of component-mounting substrates and a plurality of through holes on which shield case-mounting electrodes are respectively formed; establishing a state in which a plurality of shield case pawls are inserted into the plurality of through holes to cover the components with shield cases, and solder is buried in the plurality of through holes; thereafter securing the plurality of shield cases to the sheet substrate to cover the components by melting the solder to secure the shield case pawls to the shield case-mounting electrodes of the through holes by the solder; and thereafter dividing the sheet substrate into the plurality of component-mounting substrates by cutting the sheet substrate, thereby producing a plurality of the electronic components each including the component-mounting substrate, the component mounted on the component-mounting substrate and the shield case secured to the component-mounting substrate for covering the component.

15 Claims, 3 Drawing Sheets

ELECTRONIC COMPONENT MANUFACTURING METHOD

This application claims benefit of U.S. provisional application Ser. No. 60/103,854, filed on Oct. 12, 1998.

BACKGROUND OF THE INVENTION

1. Field of the Invention

The present invention relates to an electronic component and a manufacturing method thereof, and more particularly, to a surface mounting type electronic component which is a complex module of a high frequency band required to be covered with a shield case such as a portable telephone, a VCO (Voltage Controlled Oscillator) of communication equipment, a PLL (Phase-Locked Loop) synthesizer module, a filter, a duplexer and an RF power amplifier, and the present invention also relates to a manufacturing method of such an electronic component.

2. Description of the Related Art

In recent years, as penetration of portable telephone, cordless telephone and the like increases, in order to miniaturize these radio communication apparatuses and to lower prices thereof, research has been done, as one of objects therefor, for reducing a size, lowering prices and enhancing a performance of a surface mounting type electronic component which is a complex module required to be covered with a shield case such as a VCO, an RF power amplifier and the like. Such an electronic component is required to be miniaturized, and a mounting structure of the shield case is large and a size of the electric component is influenced by the mounting structure. Further, the price of the electric component is largely influenced by the mounting structure and a mounting method of the shield case.

FIG. 3 is a partially broken perspective view for explaining one example of the VCO and a manufacturing method hereof (see Utility Model Registration Application Laid-open No. 5-21446). The VCO 200 comprises a component-mounting substrate 220, components 240 and a shield case 210. The components 240 are mounted inside a component-mounting surface 227 of the component-mounting substrate 220, a mounting electrode 222 for the shield case 210 is disposed on an outer periphery of the component-mounting substrate 220, and terminal electrodes 226 are disposed on a back surface 229 of the component-mounting substrate 220. A shield case edge 212 for substrate mounting is formed on the shield case 210. A solder 230 is formed on the shield case-mounting electrode 222 of the component-mounting substrate 220 by printing and forming the solder 230 on the shield case-mounting electrode 222 at the same time when solder for mounting the components 240 is printed, and thereafter melting and solidifying the solder 230 when the components 240 are mounted. This VCO 200 is produced by dividing a sheet substrate for producing a large number of pieces, i.e., the sheet substrate having a plurality of the component-mounting substrates 220, into each of the component-mounting substrates 220, then melting again the solder 230 on the component-mounting substrate 220 using an exclusive apparatus, and soldering the shield case edge 212 to the shield case-mounting electrode 222 on the component-mounting substrate 220.

FIG. 4 is a partially broken perspective view for explaining another example of a VCO and a manufacturing method thereof. The VCO 300 comprises a component-mounting substrate 320, components 340 and a shield case 310. There is no shield case-mounting electrode 222 on the component-mounting surface 227 of the component-mounting substrate 220 shown in FIG. 3, and this is a mounting method of the shield case suitable for miniaturizing. Shield case-mounting electrodes 322 and end surface electrodes 326 are formed on side surfaces 321 of the component-mounting substrate 320, and the shield case pawls 312 for substrate mounting are formed on lower portions of the shield case 310. The components 340 are mounted on a component-mounting surface 327 of the component-mounting substrate 320. This VCO 300 is produced by dividing a sheet substrate having a plurality of the component-mounting substrates 320 into each of the component-mounting substrates 320, thereafter covering the component-mounting substrate 320 with the shield case 310 from the side of the component-mounting surface 327, and fixing the shield case pawls 312 to the shield case-mounting electrodes 322 of the component-mounting substrate 320 with solder 330 using a soldering iron, an exclusive soldering robot or the like.

FIG. 5 is an exploded view for explaining still another example of a VCO and a manufacturing method thereof (see journal technical disclosure No. 94-20470 issued by Japan Institute of Invention and Innovation). The VCO 400 comprises a component-mounting substrate 420, components 440 and a shield case 410. The components 440 are mounted on a component-mounting surface 427 of the component-mounting substrate 420. In side surfaces 421 of the component-mounting substrate 420, shield case-mounting electrodes 422 are formed as end surface electrodes in side surfaces of ¾ divided through holes 424 each obtained by dividing a elongated through hole into ¾. Terminal electrodes 426 are also formed in the side surfaces 421 of the component-mounting substrate 420. Shield case pawls 412 whose central portions are expanded are formed on lower portions of the shield case 410. This VCO 400 is produced by pressing under pressure the shield case pawls 412 into the shield case-mounting electrodes 422 from the side of the component-mounting surface 417 on which the components 440 are mounted, thereby fixing the shield case 410 and the component-mounting substrate 420 to each other without soldering. This technique contributes to miniaturization, because the shield case-mounting electrodes are not disposed on the component-mounting surface 427 of the component-mounting substrate 420. Further, there is a feature that a soldering step and a cleaning step are unnecessary.

According to the method shown in FIG. 3, since the shield case-mounting electrode 222 must be disposed on the outer periphery of the component-mounting surface 227 of the component-mounting substrate 220, this is not suitable for miniaturization. Further, the solder 230 on the shield case-mounting electrode 222 is printed and formed at the same time when the solder for mounting the components 240 is printed. Therefore, the solder 230 is once melted when the components 240 are mounted and flux in the solder is not in active state and thus, it is necessary to improve the wettability of the solder by solder-plating on the lower surface of the shield case edge 212 of the shield case 210 in an actual case, and the price is increased accordingly. Further, there is a problem that it is necessary to use the exclusive apparatus for soldering the shield case-mounting electrode 222 and the shield case edge 212 of the shield case 210, and the price is further increased accordingly. Furthermore, according to such a structure, since the shield case must be mounted after the sheet substrate having the plurality of component-mounting substrates 220 is divided into each of the component-mounting substrates 220, this is not suitable for rationality such as a collective production in a state of the sheet substrate.

According to the method shown in FIG. 4, as the method shown in FIG. 3, after the sheet substrate having the plurality of component-mounting substrates 320 is divided into each of the component-mounting substrates 320, the shield case-mounting electrodes 322 and the shield case pawls 312 are soldered to each other on the side surfaces 321 of the component-mounting substrate 320, and this is not suitable for rationality. Further, if the number of the shield case pawls 312 and the number of the shield case-mounting electrodes 322 of the component-mounting substrate 320 are increased so as to strengthen the shielding properties, working time is increased accordingly. Furthermore, there is a problem that the price is increased if the exclusive soldering robot is employed. Further, since soldering is carried out after the substrate is divided, there is a problem that solder comes out from an outside shape of the product and thus, the product can not be miniaturized accordingly.

According to the method shown in FIG. 5, since the shield case pawls 412 are simply pressed and fitted under pressure into the ¾ divided through holes 424 in which the shield case-mounting electrodes 422 are formed, the reliability of mounting and connection of the shield case pawls 412 is inferior. Further, the smaller the product (VCO 400 which is a surface mounting type electronic component) becomes, the greater the ratio of the product occupied by the ¾ divided through holes formed in the side surfaces and therefore, this is not suitable for miniaturization. Furthermore, even if a diameter of each of the ¾ divided through holes is reduced excessively or unreasonably to reduce the size of the shield case pawls 412, they can not be well fitted under pressure to each other because of the working precision, and a phenomenon that the shield case pawls 412 are not contacted with the shield case-mounting electrodes 422 well is generated.

SUMMARY OF THE INVENTION

Therefore, an object of the present invention is to provide a manufacturing method of an electronic component in which a shield case can be mounted to a component-mounting substrate reliably and productivity is excellent.

Another object of the invention is to provide an electronic component having a shield case fixed to a component-mounting substrate, capable of being miniaturized and having excellent reliability for mounting the shield case, and to provide a manufacturing method of the electronic component having excellent productivity.

According to a first aspect of the present invention, there is provided a manufacturing method of an electronic component including a component-mounting substrate, a component mounted on the component-mounting substrate, and a shield case mounted on the component-mounting substrate for covering the component, comprising the steps of:

mounting the components on a component-mounting surface of a sheet substrate having a plurality of the component-mounting substrates and a plurality of through holes into which pawls of a plurality of shield cases respectively corresponding to the plurality of component-mounting substrates can be inserted and on which through holes shield case-mounting electrodes are respectively formed;

establishing a state in which the plurality of shield case pawls are inserted into the plurality of through holes of the sheet substrate to cover the components with the shield cases, and solder is buried in the plurality of through holes;

thereafter securing the plurality of shield cases to the sheet substrate to cover the components by melting the solder to secure the shield case pawls to the shield case-mounting electrodes of the through holes by the solder; and thereafter dividing the sheet substrate into the plurality of component-mounting substrates by cutting the sheet substrate, thereby producing a plurality of the electronic components each including the component-mounting substrate, the component mounted on the component-mounting substrate and the shield case adhered to the component-mounting substrate for covering the component.

According to a second aspect of the present invention, there is provided an electronic component, comprising a component-mounting substrate, a component mounted on the component-mounting substrate, and a shield case mounted on the component-mounting substrate for covering the component, wherein the component-mounting substrate comprises a first main surface, a second main surface opposed to the first main surface, and a side surface between the first and second main surfaces;

the component is mounted on the first main surface;

grooves extending from the first main surface to the second main surface of the component-mounting substrate is formed in the component-mounting substrate;

shield case-mounting electrodes are formed on a side surface of each of the grooves;

shield case pawls are inserted into the grooves and solder is charged in the grooves;

the shield case pawls are secured to the shield case-mounting electrodes formed on the side surfaces of the grooves with the solder; and the side surface of the component-mounting substrate are flush with exposed surfaces of the solder exposed from the grooves, or with the exposed surfaces of the solder exposed from the grooves and exposed surfaces of the shield case pawls.

DESCRIPTION OF THE PREFERRED EMBODIMENT

Figure 1:
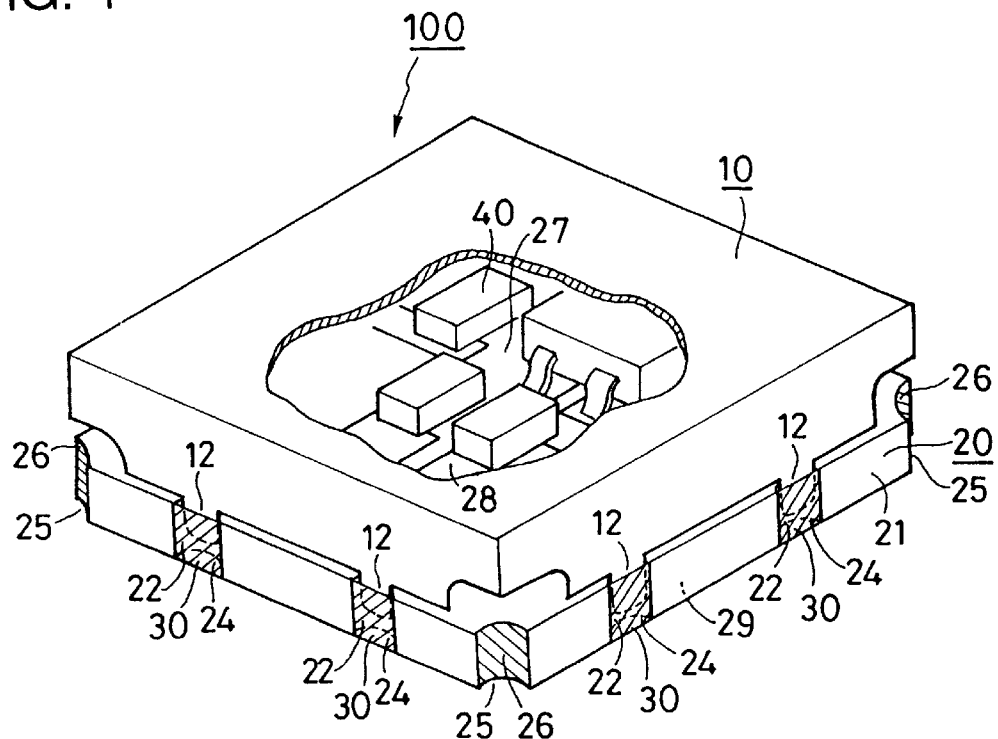
FIG. 1 is a partially broken perspective view for explaining a VCO and a manufacturing method thereof according to an embodiment of the present invention.

According to a first aspect of the present invention, there is provided a manufacturing method of an electronic component including a component-mounting substrate, a component mounted on the component-mounting substrate, and a shield case mounted on the component-mounting substrate for covering the component, comprising the steps of:

mounting the components on a component-mounting surface of a sheet substrate having a plurality of the component-mounting substrates and a plurality of through holes into which pawls of a plurality of shield cases respectively corresponding to the plurality of component-mounting substrates can be inserted and on which through holes shield case-mounting electrodes are respectively formed;

establishing a state in which the plurality of shield case pawls are inserted into the plurality of through holes of the sheet substrate to cover the components with the shield cases, and solder is buried in the plurality of through holes;

thereafter securing the plurality of shield cases to the sheet substrate to cover the components by melting the solder to secure the shield case pawls to the shield case-mounting electrodes of the through holes by the solder; and thereafter dividing the sheet substrate into the plurality of component-mounting substrates by cutting the sheet substrate, thereby producing a plurality of the electronic components each including the component-mounting substrate, the component mounted on the component-mounting substrate and the shield case adhered to the component-mounting substrate for covering the component.

In the present invention, since shield case pawls are secured to the shield case-mounting electrodes by soldering, the reliability of mounting and connection of the shield case is excellent.

As a method for mounting the shield case by soldering in this manner, the following method is employed. First, the plurality of shield case pawls are inserted into the plurality of through holes in the sheet substrate having the plurality of component-mounting substrates, the components are covered with the shield case, and solder is buried in the plurality of through holes. Then, in this state, the solder is melted to secure the shield case pawls to the shield case-mounting electrodes of the through holes, thereby securing the plurality of shield cases to the sheet substrate while covering the components. Therefore, the shield cases for one substrate can be mounted all at once, and the processing ability of mounting step of the shield cases is enhanced. Further, the subsequent imprinting adjusting and electrically inspecting steps can be carried out by handling by the sheet substrate and therefore, the processing ability as a whole can largely be enhanced. Further, even if the number of the shield case pawls and the number of the shield case-mounting electrodes are increased so as to strengthen the shielding properties, the working time is not increased.

Further, in the present invention, the shield case is not soldered using solder on the component-mounting surface of the component-mounting substrate, but is soldered using solder buried in the through hole. Therefore, the solder used when the shield case is mounted is not the one that is once melted and solidified and again melted, but the one that is newly supplied to the through holes be ore the shield case is soldered. Therefore, the shield case pawls and the shield case-mounting electrodes of the sheet substrate are excellently soldered to each other, the yield is enhanced, and it is unnecessary to apply any special treatment to the shield case.

When small electronic components are produced, even if variation in shape (working variation) of the shield case pawls and the shield case-mounting electrodes of the component-mounting substrate hinders the press fitting of the shield case pawls, since the pawls are adhered using solder in the present invention, the variation in shape is absorbed, and the shield case can be mounted stably.

Further, since the shield case is mounted by securing the shield case pawls to the through holes of the component-mounting substrate, shield case-mounting electrodes are not required on the component-mounting substrate, and the electronic component can be miniaturized.

Furthermore, since the required apparatuses are a soldering printer, a mounting device and a reflow furnace which are general apparatuses for producing a hybrid IC, new investment of equipment is unnecessary.

The sheet substrate on which the shield cases are mounted is then cut by a substrate dividing machine such as a dicing machine, and divided into the plurality of component-mounting substrates. Preferably, the sheet substrate is cut by cutting the sheet substrate, the through holes and solder in the through holes in the same plane.

With this method, the through holes in which the melted and solidified solder is buried are also cut along the end of the substrate, and the solder should not come out from the outside shape of the component-mounting substrate which is formed by division and therefore, this dividing method contributes to miniaturization.

Since the shield case pawls are adhered to the shield case-mounting electrodes of the through holes by solder, the shield case pawls can be mounted even by divided through holes of ½ or less without requiring ¾ divided through holes which take up a lot of space, and this contributes to the miniaturization. Here, it should be noted that when a through hole having two semicircles whose shapes of sections are opposed to each other, the term "through hole of ½ or less" means a through hole which is divided and formed such that each of these two semicircles becomes ½ or less, and when a through hole having a circle in section, the term "through hole of ½ or less" means a through hole which is divided and formed such that a shape of a section of the through hole becomes ½ or less.

Preferably, terminal electrodes are further formed on the component-mounting substrate. Each of the terminal electrode is formed on a side surface of a terminal electrode-partial through hole formed by cutting a terminal electrode-through hole in one or more predetermined planes. The sheet substrate is cut by cutting the sheet substrate, the through holes, the solder in the through holes and the terminal electrode-through holes together in the same plane.

With this method, the terminal electrode-partial through holes formed by cutting the terminal electrode-through holes can simultaneously be cut together with the through holes of the shield case-mounting electrodes and the solder therein. As a result, the terminal electrode on the side surface of the terminal electrode-partial through hole can be cut along the end of the substrate and therefore, the terminal electrode should not come out from the outside shape of the component-mounting substrate which is formed by division.

Preferably, the shield case pawls are secured in the through holes and the shield case pawls are shallower than the shield case-mounting electrodes.

With this design, the shield case-mounting electrode is not covered entirely by the shield case pawl, and a lower portion of the shield case-mounting electrode is exposed from the shield case pawl. The shield case-mounting electrode is not only used for mounting the shield case pawl, but also used as the electrode for mounting the electronic component. For example, even if variation or the like in size of the shield case is generated and the Ni plating formed on the surface of the shield case pawl for soldering is scraped by the dicing machine or the like, when such an electronic component is mounted, since the shield case-mounting electrode has a portion which is not covered with the shield case pawl, a solder fillet is formed. Preferably, gold is plated or solder leveler is formed on a surface of the shield case-mounting electrode.

It is preferable that the shield case-mounting electrode extends from the component-mounting surface of the component-mounting substrate to a surface opposite to the component-mounting surface. In this case, it is preferable that the shield case pawl is adhered in the through hole to a depth of ½ or more and ⅔ or less of a depth of the shield case-mounting electrode.

Preferably, the solder buried in the through hole is paste solder, molten solder or solid solder particle.

Preferably, the step of establishing the state in which the plurality of shield case pawls are inserted into the plurality of through holes of the sheet substrate to cover the components with the shield case, and for the solder to be buried in the plurality of through holes is a step of establishing a state in which the solder is first buried in the plurality of through holes and then, the plurality of shield case pawls are inserted into the plurality of through holes of the sheet substrate to cover the components with the shield case.

Reversely, the plurality of shield case pawls may be inserted into the plurality of through holes of the sheet substrate to cover the components with the shield case and then, the solder may be buried in the plurality of through holes.

Preferably, the solder is buried in the plurality of through holes by printing paste solder to the sheet substrate using a solder mask having solder-through-holes corresponding to the through holes. The solder can be buried in the through holes using an injecting device such as a dispenser instead of the solder mask.

Further, according to a second aspect of the present invention, there is provided an electronic component, comprising a component-mounting substrate, a component mounted on the component-mounting substrate, and a shield case mounted on the component-mounting substrate for covering the component, wherein the component-mounting substrate comprises a first main surface, a second main surface opposed to the first main surface, and a side surface between the first and second main surfaces;

the component is mounted on the first main surface;

grooves extending from the first main surface to the second main surface of the component-mounting substrate is formed in the component-mounting substrate;

shield case-mounting electrodes are formed on a side surface of each of the grooves;

shield case pawls are inserted into the grooves and solder is charged in the grooves;

the shield case pawls are secured to the shield case-mounting electrodes formed on the side surfaces of the grooves with the solder; and the side surface of the component-mounting substrate are flush with exposed surfaces of the solder exposed from the grooves, or with the exposed surfaces of the solder exposed from the grooves and exposed surfaces of the shield case pawls.

In this electronic component, since the shield case pawls are secured to the shield case-mounting electrode with the solder, the reliability of the mounting and connection of the shield case is excellent.

Further, since the shield case is mounted by securing the shield case pawls to the grooves in the side surfaces of the component-mounting substrate, the shield case-mounting electrode is not required on the electronic component-mounting substrate, and the electronic component can be miniaturized.

Further, since the side surface of the component-mounting substrate is flush with the exposed surfaces of the solder exposed from the groove, or with the exposed surfaces of the solder exposed from the groove and the exposed surface of the shield case pawls, the solder and the shield case pawls should not come out from the outside shape of the component-mounting substrate, and this dividing method can contribute to miniaturization.

Preferably, the shield case pawls are buried in the solder in the grooves, and the side surface of the component-mounting substrate is flush with the exposed surfaces of the solder exposed from the grooves.

Preferably, the shield case pawls are secured in the grooves and the shield case pawls are shallower than the shield case-mounting electrodes formed in the grooves.

With this design, the shield case-mounting electrode is not covered entirely by the shield case pawl, and a lower portion of the shield case-mounting electrode is exposed from the shield case pawl. As a result, when the electronic component is mounted, even if the variation or the like in size of the shield case is generated and the Ni plating formed on the surface of the shield case pawl for soldering is scraped by the dicing machine or the like, a solder fillet is reliably formed on a portion of the shield case-mounting electrode which is not covered with the shield case pawl. Preferably, gold is plated or solder leveler is formed on a surface of the shield case-mounting electrode.

It is preferable that the shield case-mounting electrode is formed to extend from the first main surface to the second main surface. In this case, it is preferable that the shield case pawl is secured in the groove to a depth of ½ or more and ⅔ or less of a depth of the shield case-mounting electrode.

Next, a VCO and a manufacturing method thereof according to an embodiment of the present invention will be explained with reference to the drawings.

Figure 2:
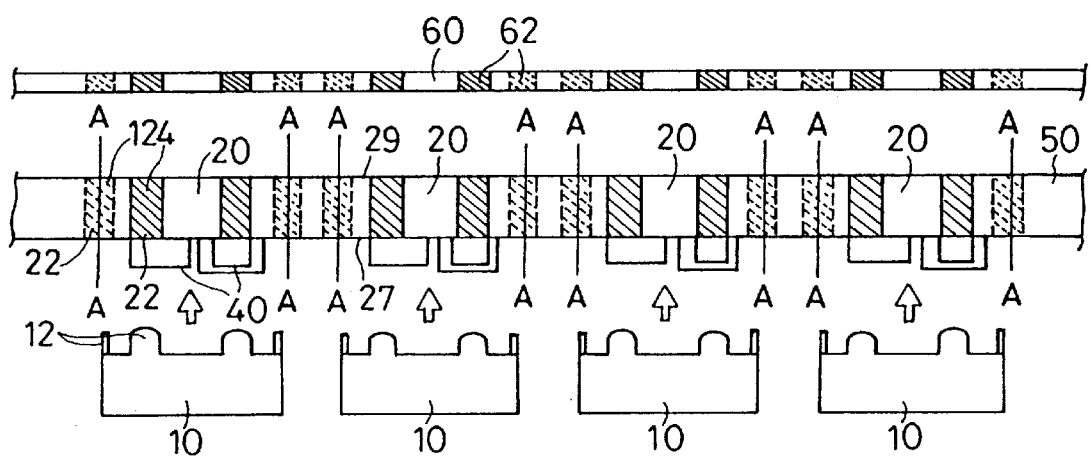
FIG. 2 is a sectional view for explaining the VCO and the manufacturing method thereof according to the embodiment of the present invention.
Figure 3:
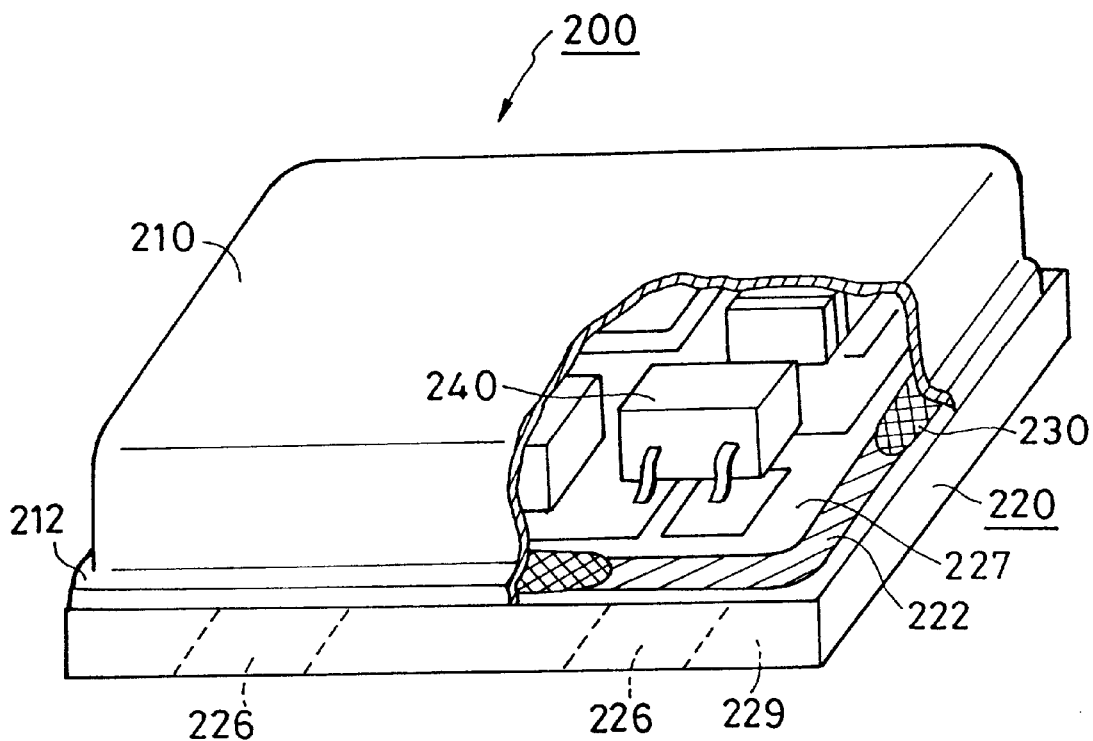
FIG. 3 is a partially broken perspective view for explaining one example of a VCO and a manufacturing method thereof.
Figure 4:
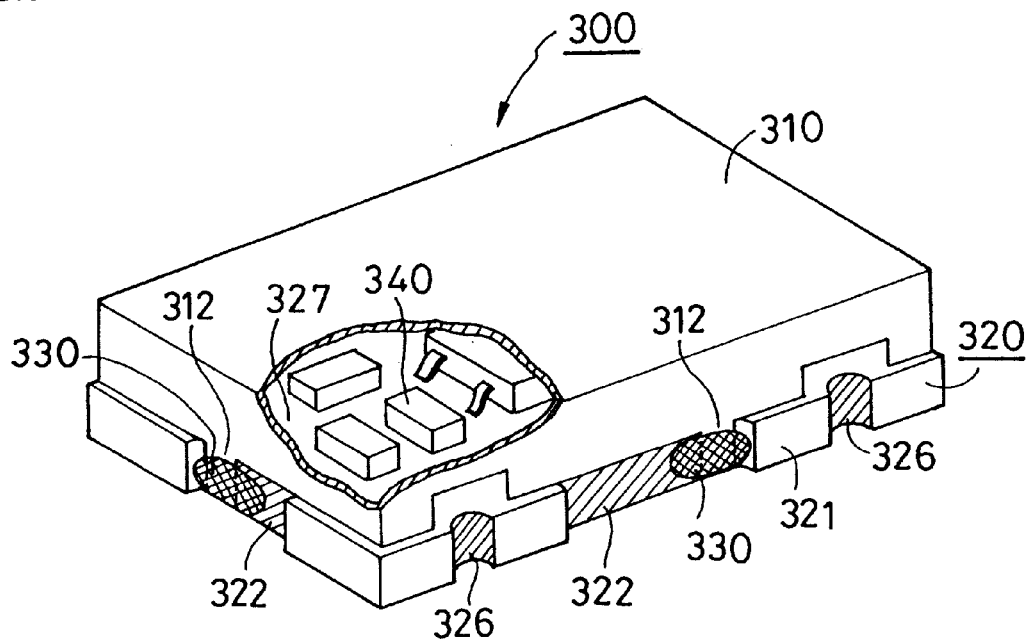
FIG. 4 is a partially broken perspective view for explaining another example of a VCO and a manufacturing method thereof.
Figure 5:
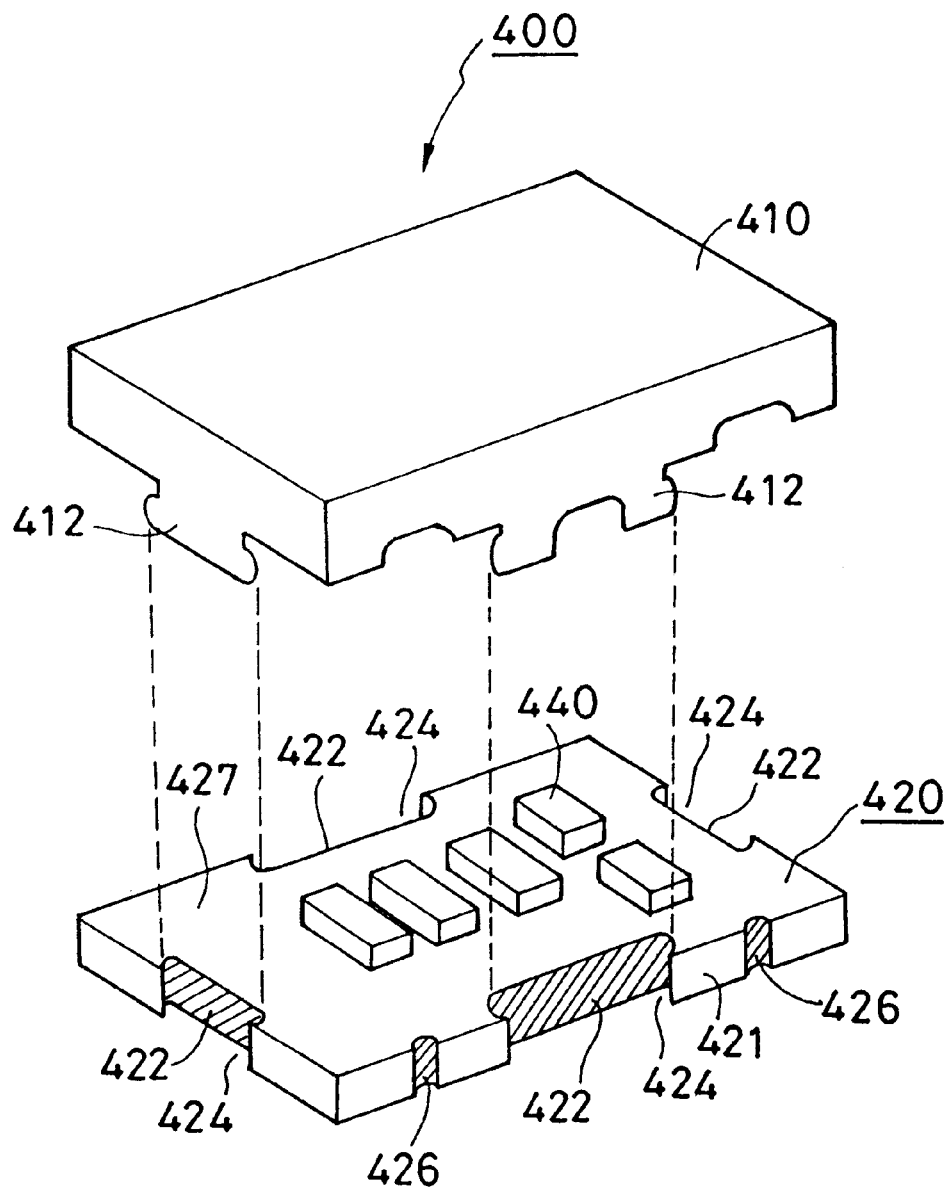
FIG. 5 is a partially broken perspective view for explaining further another example of a VCO and a manufacturing method thereof.

FIG. 1 is a partially broken perspective view for explaining the VCO and the manufacturing method thereof of the embodiment of the present invention, and FIG. 2 is a sectional view for explaining the VCO and the manufacturing method thereof according to the embodiment of the present invention.

The VCO 100 of the present embodiment is of a surface mounting type, and comprises a component-mounting substrate 20, components 40 and a shield case 10. The components 40 are mounted on a component-mounting surface 27 of the component-mounting substrate 20, and are connected to wiring patterns 28. The shield case 10 is made of stainless steel, and a surface thereof is plated with Ni.

Four side surfaces 21 of the component-mounting substrate 20 are provided with grooves comprising divided through holes 24 which are divided into ½ or less and extended from the component-mounting surface 27 to a back surface 29 of the component-mounting substrate 20. A section of each of the divided through holes 24 is of an arc equal to or smaller than a semicircular. Each of the divided through holes 24 is provided at its side surface with a shield case-mounting electrode 22 which extends from the component-mounting surface 27 to the back surface 29 of the component-mounting substrate 20. A surface of the shield case-mounting electrode 22 is plated with gold.

Shield case pawls 12 are formed on lower portions of the shield case 10. The shield case 10 is provided to cover the components 40 from the side of the component-mounting surface 27 of the component-mounting substrate 20, and the shield case-mounting electrodes 22 and the shield case pawls 12 are soldered and fixed to each other by solder 30. Each of the shield case pawls 12 is buried in the solder 30, and only the solder 30 is exposed to the side surface 21 of the component-mounting substrate 20 from the divided through hole 24. The exposed surface of the solder 30 and the side surface 21 of the component-mounting substrate 20 are flush with each other. A tip end of each of the shield case pawls 12 is located at about ⅔ of the depth of the component-mounting substrate 20.

The side surfaces 21 of the component-mounting substrate 20 are provided with grooves comprising divided through holes 25 which are divided into ½ or less and extended from the component-mounting surface 27 to the back surface 29 of the component-mounting substrate 20. A section of each of the divided through holes 25 is of an arc which is ¼ or less of a circular. The divided through holes 25 are provided at four corners of the component-mounting substrate 20. Each of the divided through holes 25 is provided at its side surface with a terminal electrode 26 which is extended from the component-mounting surface 27 to the back surface 29 of the component-mounting substrate 20. A surface of the terminal electrode 26 is plated with gold.

Next, the manufacturing method of the VCO 100 of the present embodiment will be explained with reference to FIGS. 1 and 2.

First, through holes 124 are formed in a sheet substrate 50 having a plurality of the component-mounting substrates 20, the shield case-mounting electrode 22 is formed on a side surface of each of the through holes 124, terminal electrode through holes (not shown) are also formed in the sheet substrate 50, the terminal electrode 26 plated with gold is formed on a side surface of each of the terminal electrode through holes, the predetermined wiring pattern 28 are formed on the component-mounting surface 27, and solder is formed thereon by screen printing.

Thereafter, the components 40 are soldered by reflowing on the component-mounting surface 27 of the sheet substrate 50 which has not yet been divided.

Next, the component-mounting surface 27 is faced down, and a solder mask 60 is set on the back surface 29 which is on the opposite side of the component-mounting surface 27. Solder-through-holes 62 are formed in the solder mask 60 at positions thereof opposed to the through holes 124 in which the shield case-mounting electrodes 22 are formed. Paste solder is printed using the solder mask 60, and the paste solder is charged into the through holes 124.

Then, the component-mounting surface 27 of the sheet substrate 50 is faced up, and the plurality of Ni-plated shield cases 10 are mounted on the sheet substrate 50 by a mounting apparatus. At that time, the shield cases 10 are mounted such that the shield case pawls 12 are inserted into the through holes 124. Then, the sheet substrate 50 is put in a reflow furnace, the paste solder in the through holes 124 are melted to fix the shield cases 10 and the sheet substrate 50 to each other. During this reflowing, the components 40 should not be separated from the wiring patterns 28 due to surface tension of the solder formed on the wiring patterns 28, and a bridge between the wiring patterns 28 should not be generated.

Next, a collective imprinting is carried out in a state of the sheet substrate. Depending on the situation, a frequency adjustment and an electrical inspection are also carried out collectively in the state of the sheet substrate.

Thereafter, the sheet substrate 50 is cut along the cutting lines A—A by a dicing machine to divide the sheet substrate 50 to produce the surface mounting type VCO 100 as shown in FIG. 1. When the sheet substrate 50 is cut, the through holes 124 are also divided into the divided through holes 24, and the solder 30 is also cut and exposed from the divided through holes 24, and the exposed surfaces are flush with the side surfaces 21 of the component-mounting substrate 20. Further, when the sheet substrate 50 is cut, the terminal electrode through holes (not shown) provided in the sheet substrate 50 are also cut simultaneously, and the divided through holes 25 are formed.

The method of the present embodiment makes it possible to stably mount the shield case 10 on an extremely small VCO 100 having a size as small as 5.0 mm×5.0 mm×1.85 mm with the high yield.

In the present embodiment, since the shield case pawls 12 are fixed to the shield case-mounting electrodes 22 of the divided through holes 24 by solder 30, the reliability of the mounting and connection of the shield case 10 is excellent.

When the size of the component-mounting substrate 20 and the shield case 10 is extremely small, the variation in worked products is increased as compared with the size, but such variation can be absorbed by securing them with the solder 30.

Further, since the shield cases 10 can be mounted on the sheet substrate 50 in the state of the sheet substrate, not only the mounting step of the shield cases 10, but also the subsequent imprinting step, the frequency adjusting step and the electrically inspecting step can be carried out in the state of the sheet substrate and therefore, the processing ability is largely enhanced. Further, even if the number of the shield case pawls 12 and the number of the shield case-mounting electrodes 22 of the divided through holes 24 are increased so as to strengthen the shielding properties, the working time is not increased.

Furthermore, since the shield case 10 is soldered by the solder 30 buried in the through holes 124, the solder at the time of mounting the shield case 10 is not the one that is once melted and solidified and then again melted, but the one that is newly supplied to the through holes 124 before the shield case 10 is soldered. Therefore, the shield case pawls 12 and the shield case-mounting electrodes 22 of the sheet substrate 50 are excellently soldered to each other, the yield is enhanced, and it is unnecessary to apply any special treatment to the shield case 10.

Since the shield case 10 is mounted by securing the shield case pawls 12 to the divided through holes 24 of the component-mounting substrate 20, it is unnecessary to provide the shield case-mounting electrodes on the component-mounting substrate 20, and the VCO can be miniaturized accordingly.

Since the required apparatuses are the soldering printer, the mounting device and the reflow furnace which are general apparatuses for manufacturing a hybrid IC such as the VCO, it is unnecessary to spend costs on equipment.

Further, in dividing the sheet substrate 50, the through holes 124 in which the solder 30 is buried are also divided with the dicing machine and therefore, the solder 30 does not come out from the side surfaces 21 of the component-mounting substrate 20, and this contributes to the miniaturization.

Furthermore, the shield case pawls 12 are secured to the shield case-mounting electrodes 22 of the divided through holes 24 with the solder 30. Therefore, the shield case pawls 12 can be mounted even by the divided through holes 24 which are divided into ½ or less without requiring ¾ divided through holes which taken up a lot of space, and this contributes to the miniaturization.

When the sheet substrate 50 is cut by the dicing machine, the terminal electrode through holes (not shown) provided in the sheet substrate 50 are cut simultaneously when the through holes 124 in which the solder 30 is buried are divided and therefore, the divided through holes 25 in which the terminal electrodes 26 are formed can be formed simultaneously. The terminal electrodes 26 do not come out from the side surfaces 21 of the component-mounting substrate 20 which is formed by dividing the sheet substrate 50, and this contributes to the miniaturization.

Each of the shield case pawls 12 of the shield case 10 is designed such that its length is about ⅔ of the thickness of the component-mounting substrate 20, so that the shield case-mounting electrode 22 is only covered through a depth corresponding to ⅔ of the thickness of the component-mounting substrate 20 when the shield case pawl 12 is secured in the divided through hole 24 by the solder 30. As a result, a lower about one-third of the shield case-mounting electrode 22 is not covered with the shield case pawl 12. The shield case-mounting electrode 22 is not only used for mounting the shield case pawl 12, but also used as the terminal electrode when the VCO is mounted. Even if variation or the like in size of the shield case 10 is generated and the Ni plating formed on the surface of the shield case pawl 12 for soldering is scraped by the dicing machine, when the VCO 100 of the present embodiment is mounted, since the shield case-mounting electrode 22 has a portion which is not covered with the shield case pawl 12, a solder fillet is formed.

Although the shield case 10 is mounted after solder imprinting in the present embodiment, there is no problem even though the operations are carried out in the opposite order.

Although the solder mask 60 is used for burying solder in the through hole 124 in the present embodiment, an injecting device such as a dispenser may be used. Further, although the dicing machine is used for dividing the sheet substrate 50 in the present embodiment, another substrate dividing machine may be used.

In the present invention, since the shield case pawl is secured to the shield case-mounting electrode by the solder, the reliability of mounting and connection of the shield case is excellent.

Further, since the shield cases can be mounted in the state of the sheet substrate having the plurality of component-mounting substrates, not only the mounting step of the shield cases, but also the subsequent imprinting step, the adjusting step and the electrically inspecting step can be carried out in the state of the sheet substrate and therefore, the processing ability is largely enhanced.

Further, since it is unnecessary to dispose the shield case-mounting electrode on the component-mounting substrate, the electronic component can be miniaturized.

Furthermore, the solder is charged into the through hole of the sheet substrate, the shield case pawl is inserted to the through hole and in that state, the shield case pawl is fixed by melting the solder. Therefore, the conformability of the solder is high. Even if the variation in worked through hole and the shield case is generated slightly, no problem is caused since they are adhered by soldering.

Further, since the required apparatuses are general apparatuses for manufacturing a hybrid IC, such as the soldering printer, the mounting apparatus and the reflow furnace, new investment for equipment is unnecessary.

When the sheet substrate on which the shield cases are mounted is cut by a substrate dividing apparatus such as the dicing machine, the sheet substrate, the through hole and solder in the through hole are cut in the same plane and thus, the through hole in which the melted and solidified solder is buried is also cut along the end of the substrate, and the solder should not come out from the outside shape of the component-mounting substrate which is formed by division and therefore, this contributes to miniaturization.

Further, since the shield case pawl is secured to the shield case-mounting electrode of the through hole by the solder, the shield case pawls can be mounted even with the divided through hole which is divided into ½ or less without requiring ¾ divided through hole which takes up a lot of space, and this contributed to the miniaturization.

Furthermore, also in the electronic component of the present invention, since the side surface of the component-mounting substrate is flush with exposed surfaces of the solder exposed from the groove, or with the exposed surfaces of the solder exposed from the groove and exposed surface of the shield case pawls, the solder should not come out from the outside shape of the component-mounting substrate, and this contributes to miniaturization.

What is claimed is:

1. A manufacturing method of an electronic component including a component-mounting substrate, a component mounted on said component-mounting substrate, and a shield case mounted on said component-mounting substrate for covering said component, comprising the steps of:

mounting electronic components on a component-mounting surface of a sheet substrate having a plurality of component-mounting substrates and a plurality of through holes into which pawls of a plurality of shield cases respectively corresponding to said plurality of component-mounting substrates can be inserted and on which through holes shield case-mounting electrodes are respectively formed;

inserting said plurality of shield case pawls into said plurality of through holes of said sheet substrate to cover said components with said shield cases, and inserting solder in said plurality of through holes;

thereafter securing said plurality of shield cases to said sheet substrate to cover said components by melting said solder to secure said shield case pawls to said shield case-mounting electrodes of said through holes by said solder; and thereafter dividing said sheet substrate into said plurality of component-mounting substrates by cutting said sheet substrate, thereby producing a plurality of said electronic components each including said component-mounting substrate, said component mounted on said component-mounting substrate and said shield case secured to said component-mounting substrate for covering said component.

2. The manufacturing method of an electronic component according to claim 1, wherein the sheet substrate is cut by cutting the sheet substrate, the through holes and the solder in the through holes together in a same plane.

3. The manufacturing method of an electronic component according to claim 2, wherein terminal electrodes are further formed on the plurality of component-mounting substrate, each of the terminal electrodes is formed on a side surface of a terminal electrode-partial through hole formed by cutting a terminal electrode-through hole in one or more predetermined planes, and the sheet substrate is cut by cutting the sheet substrate, the through holes, the solder in the through holes and the terminal electrode-through holes together in the same plane.

4. The manufacturing method of an electronic component according to claim 1, wherein the shield case pawls are secured in the through holes and the shield case pawls are shorter than the shield case-mounting electrodes.

5. The manufacturing method of an electronic component according to claim 2, wherein the shield case pawls are secured in the through holes and the shield case pawls are shorter than the shield case-mounting electrodes.

6. The manufacturing method of an electronic component according to claim 3, wherein the shield case pawls are secured in the through holes and the shield case pawls are shorter than the shield case-mounting electrodes.

7. The manufacturing method of an electronic component according to claim 1, wherein the solder inserted in the through holes is paste solder, molten solder or solid solder particle.

8. The manufacturing method of an electronic component according to claim 2, wherein the solder inserted in the through holes is paste solder, molten solder or solid solder particle.

9. The manufacturing method of an electronic component according to claim 3, wherein the solder inserted in the through holes is paste solder, molten solder or solid solder particle.

10. A manufacturing method of an electronic component according to claim 1, wherein the step of inserting the plurality of shield case pawls into the plurality of through holes of the sheet substrate to cover the components with the shield case, and for the solder to be inserted in the plurality of through holes is a step of first inserting the solder in the plurality of through holes and then, the plurality of shield case pawls are inserted into the plurality of through holes of the sheet substrate to cover the components with the shield case.

11. The manufacturing method of an electronic component according to claim 2, wherein the step of inserting the plurality of shield case pawls into the plurality of through holes of the sheet substrate to cover the components with the shield case, and for the solder to be inserted in the plurality of through holes is a step of first inserting the solder in the plurality of through holes and then, the plurality of shield case pawls are inserted into the plurality of through holes of the sheet substrate to cover the components with the shield case.

12. The manufacturing method of an electronic component according to claim 3, wherein the step of inserting the plurality of shield case pawls into the plurality of through holes of the sheet substrate to cover the components with the shield case, and for the solder to be inserted in the plurality of through holes is a step of first inserting the solder in the plurality of through holes and then, the plurality of shield case pawls are inserted into the plurality of through holes of the sheet substrate to cover the components with the shield case.

13. The manufacturing method of an electronic component according to claim 4, wherein the step of inserting the plurality of shield case pawls into the plurality of through holes of the sheet substrate to cover the components with the shield case, and for the solder to be inserted in the plurality of through holes is a step of first inserting the solder in the plurality of through holes and then, the plurality of shield case pawls are inserted into the plurality of through holes of the sheet substrate to cover the components with the shield case.

14. The manufacturing method of an electronic component according to claim 7, wherein said step inserting solder in said plurality of through in said plurality of through holes by printing solder paste to said sheet substrate using a soldering mask having solder-through-holes corresponding to said through holes.

15. The manufacturing method of an electronic component according to claim 10, wherein said step for inserting solder in said plurality of through in said plurality of through holes by printing solder paste to said sheet substrate using a soldering mask having solder-through-holes corresponding to said through holes.

* * * * *